(12) United States Patent
Yamada (10) Patent No.: US 7,205,708 B2
(45) Date of Patent: Apr. 17, 2007

(54) TUNING-FORK-TYPE PIEZOELECTRIC VIBRATING REED AND TUNING-FORK-TYPE PIEZOELECTRIC VIBRATOR

(75) Inventor: Yoshiyuki Yamada, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/297,744

(22) Filed: Dec. 8, 2005

(65) Prior Publication Data

US 2006/0087206 A1    Apr. 27, 2006

Related U.S. Application Data

(63) Continuation of application No. 10/846,842, filed on May 14, 2004, now Pat. No. 7,061,167.

(30) Foreign Application Priority Data

May 16, 2003    (JP) ............................. 2003-139208

(51) Int. Cl.
   *H03H 9/21*    (2006.01)
(52) U.S. Cl. .................................... 310/370
(58) Field of Classification Search .............. 310/370
   See application file for complete search history.

(56) References Cited

U.S. PATENT DOCUMENTS

| | | | | |
|---|---|---|---|---|
| 4,785,215 A | * | 11/1988 | Blech | ..................... 310/329 |
| 5,824,900 A | * | 10/1998 | Konno et al. | ........... 73/504.16 |
| 6,675,651 B2 | * | 1/2004 | Yanagisawa et al. | .... 73/504.14 |
| 7,015,631 B2 | * | 3/2006 | Hirasawa et al. | ........... 310/370 |

FOREIGN PATENT DOCUMENTS

| | | |
|---|---|---|
| JP | 54003487 | 6/1977 |
| JP | 56-000737 | 1/1981 |
| JP | 56-60325 | 5/1981 |
| JP | 56-061820 | 5/1981 |
| JP | 58-105612 | 6/1983 |
| JP | 10-256867 | 9/1988 |
| JP | 01-311712 | 12/1989 |
| JP | 2001-332951 | 11/2001 |
| JP | 2004-297198 | 10/2004 |

OTHER PUBLICATIONS

Patent Abstracts of Japan re Publication No. 56061820.
Communication from European Patent Office re: related appilcation.
Communication from Japanese Patent Office regarding counterpart application.

* cited by examiner

*Primary Examiner*—Darren Schuberg
*Assistant Examiner*—J. Aguirrechea
(74) *Attorney, Agent, or Firm*—Harness, Dickey & Pierce, P.L.C.

(57) ABSTRACT

A tuning-fork-type piezoelectric resonator element and a tuning-fork-type piezoelectric resonator are provided. The tuning-fork-type piezoelectric resonator element comprises a piezoelectric resonator element body including base and resonating arms extending from one end of base. A support includes a short side connected to the base and a long side extending from one end of the short side along a longitudinal direction of the piezoelectric resonator element body. A mount is provided at the tip of the long side and at the short side.

6 Claims, 7 Drawing Sheets

FIG. 1

10: TUNING-FORK-TYPE PIEZOELECTRIC VIBRATOR

16: PACKAGE BASE 18a, 18b: PACKAGE-SIDE MOUNTING ELECTRODE

20: TUNING-FORK-TYPE PIEZOELECTRIC VIBRATING REED

22: BASE

24: VIBRATING ARM

26: PIEZOELECTRIC VIBRATING REED BODY

28: SUPPORT

30: SHORT SIDE

32: LONG SIDE

34: CUT GROOVE

36: ALIGNMENT PATTERN

TUNING-FORK-TYPE PIEZOELECTRIC VIBRATING REED AND TUNING-FORK-TYPE PIEZOELECTRIC VIBRATOR

RELATED APPLICATIONS

This application is a continuation patent application of U.S. Ser. No. 10/846,842 filed May 14, 2004 now U.S. Pat. No. 7,061,167, which claims priority to Japanese Patent Application No. 2003-139208 filed May 16, 2003, all of which are hereby expressly incorporated by reference herein in their entirety.

BACKGROUND OF THE INVENTION

1. Technical Field of the Invention

The present invention relates to a tuning-fork-type piezoelectric resonator element and a tuning-fork-type piezoelectric resonator, and more particularly to a tuning-fork-type piezoelectric resonator element and a tuning-fork-type piezoelectric resonator, which are suitable for miniaturizing and thinning a tuning-fork-type piezoelectric resonator.

2. Description of the Related Art

A piezoelectric resonator, particularly, a tuning-fork-type piezoelectric resonator is known as a piezoelectric resonator that can obtain an accurate clock frequency simply and easily. Recent demands to miniaturize and thin electronic devices require a tuning-fork-type piezoelectric resonator to be miniaturized and thinned. To meet such a demand, a surface mounting type tuning-fork-type piezoelectric resonator has been developed. The tuning fork piezoelectric resonator of this surface mounting type is mounted so that the surface of a tuning-fork-type piezoelectric resonator element is made parallel to the bottom face of a package, and the tuning-fork-type piezoelectric resonator element is mounted at the bottom face of the package in the form of a cantilever.

Further, the technique of mounting a tuning-fork-type piezoelectric resonator in a package is disclosed in Japanese Unexamined Patent Application Publication No. 2001-332952. In Japanese Unexamined Patent Application Publication No. 2001-332952, the tuning-fork-type piezoelectric resonator element is mounted in the package including a package base and a cover in the form of a cantilever. Also, a concave portion having a rectangular shape in a plan view is provided at the package base adjacent to resonating arms of the tuning-fork-type piezoelectric resonator element. The provision of the concave portion allows a free end of the tuning-fork-type piezoelectric resonator element to enter the package base without contact therewith, even though the resonator element vibrates greatly due to an external shock. As a result, the tuning-fork-type piezoelectric resonator element is not deformed and the frequency characteristics are prevented from being changed.

In addition, another mounting method includes the technology disclosed in Japanese Unexamined Patent Application Publication No. 56-61820. In Japanese Unexamined Patent Application Publication No. 56-61820, a frame is provided at a tuning-fork-type piezoelectric resonator element to surround a tuning-fork-type piezoelectric resonator body. The tuning-fork-type piezoelectric resonator element is interposed between two packages, which are joined to each other and sealed by metal material. At this time, the joining and sealing are made with the frame protruding farther than the package. The protruding part of the frame functions to prevent the metal material provided at upper and lower sides of the frame from being short-circuited.

Meanwhile, in the conventional tuning-fork-type piezoelectric resonator, the tuning-fork-type piezoelectric resonator element is mounted via a base in the form of a cantilever. However, since the tuning-fork-type piezoelectric resonator element is mounted on the base in the form of a cantilever, the parallelism of the tuning-fork-type piezoelectric resonator element mounted inside the package becomes lowered, and the tuning-fork-type piezoelectric resonator element is slantingly mounted therein. Therefore, the conventional tuning-fork-type piezoelectric resonator has a problem in that the resonating arms may come in contact with the bottom face of the package or the cover, thereby stopping oscillation.

Moreover, in the conventional tuning-fork-type piezoelectric resonator described in Japanese Unexamined Patent Application Publication No. 2001-332952, in order to prevent the resonating arms from contacting with the bottom face of the package, a concave portion is formed at the bottom face of the package. The concave portion should have enough depth to reliably prevent the contact of the resonating arms with the package, and thinning the tuning-fork-type piezoelectric resonator becomes difficult. Furthermore, a base on which the resonating arms of the tuning-fork-type piezoelectric resonator protrude is mounted on the package base, causing the problem of increasing vibrating leakage and a crystal impedance (CI) value.

Furthermore, in the conventional tuning-fork-type piezoelectric resonator described in Japanese Unexamined Patent Application Publication No. 56-61820, when two electrodes of the tuning-fork-type piezoelectric resonator element and a package-side mounting electrode are electrically connected to one another by a conductive adhesive, the two electrodes of the tuning-fork-type piezoelectric resonator element and the package-side mounting electrode approach each other. Thus, the conductive adhesive may overflow, causing short-circuiting between the electrodes.

The present invention has been made to solve the above-mentioned problems, and it is an object of the present invention to provide a tuning-fork-type piezoelectric resonator element capable of being mounted in a package while keeping the parallelism thereof. It is another object of the present invention to provide a tuning-fork-type piezoelectric resonator that can be thinned using the tuning-fork-type piezoelectric resonator element.

SUMMARY

In order to achieve the above objects, the present invention provides a tuning-fork-type piezoelectric resonator element comprising: a piezoelectric resonator element body including a base and resonating arms extending from one end of the base; a support including a short side connected to the base and formed along the other end of the base, and a long side extending from an end of the short side in the longitudinal direction of the piezoelectric resonator element body; and mounts provided at the tip of the long side and at the tip of the short side.

Since the support of the tuning-fork-type piezoelectric resonator element is formed along another end of the base and the one long side of the piezoelectric resonator element body, the tuning-fork-type piezoelectric resonator element has a smaller outside dimension than the conventional tuning-fork-type piezoelectric resonator element surrounded by a frame in four directions. As a result, the size of a package for mounting the tuning-fork-type piezoelectric resonator element therein can be reduced. Further, a mount is provided at the short side and at tip of the long side to be joined to a package. The mount allows the tuning-fork-type piezoelectric resonator element to be horizontally mounted relative to the bottom face of the package.

Further, it is preferable that the long side extends from one end of the short side. As a result, the tuning-fork-type piezoelectric resonator element can have a smaller outside dimension than that the conventional tuning-fork-type piezoelectric resonator element surrounded by a frame in four directions, and the size of a package for mounting the tuning-fork-type piezoelectric resonator element can be reduced. Moreover, the number of tuning-fork-type piezoelectric resonator elements, which are obtained from one piezoelectric wafer, can be increased.

Further, it is preferable that the long side is shorter than the piezoelectric resonator element body. As a result, the tuning-fork-type piezoelectric resonator element can have a smaller outside dimension than the conventional tuning-fork-type piezoelectric resonator element. Therefore, the number of tuning-fork-type piezoelectric resonator elements, which are obtained from one piezoelectric wafer, can be increased.

The support includes a long side formed to extend from one end of the short side, and a second short side formed at the front end of the long side to face the short side, and the support has a U-shape. As a result, the tuning-fork-type piezoelectric resonator element can have a smaller outside dimension than the conventional tuning-fork-type piezoelectric resonator element surrounded by a frame in four directions. Also, the number of tuning-fork-type piezoelectric resonator elements, which are obtained from the one piezoelectric wafer, can be increased.

Further, the present invention provides a tuning-fork-type piezoelectric resonator comprising: the aforementioned tuning-fork-type piezoelectric resonator element, which is mounted in a package by the mounts; and a cover joined to an upper portion of the package. The tuning-fork-type piezoelectric resonator element can be horizontally mounted relative to the bottom face of the package. As a result, when the tuning-fork-type piezoelectric resonator element oscillates, the resonating arms are not brought in contact with the package. Thus, it is possible to reduce the thickness of the tuning-fork-type piezoelectric resonator.

DETAILED DESCRIPTION

Hereinafter, a tuning-fork-type piezoelectric resonator element and a tuning-fork-type piezoelectric resonator according to the present invention will be explained. Further, the following description is just one aspect of the present invention, and the present invention is not limited thereto.

Figure 1:
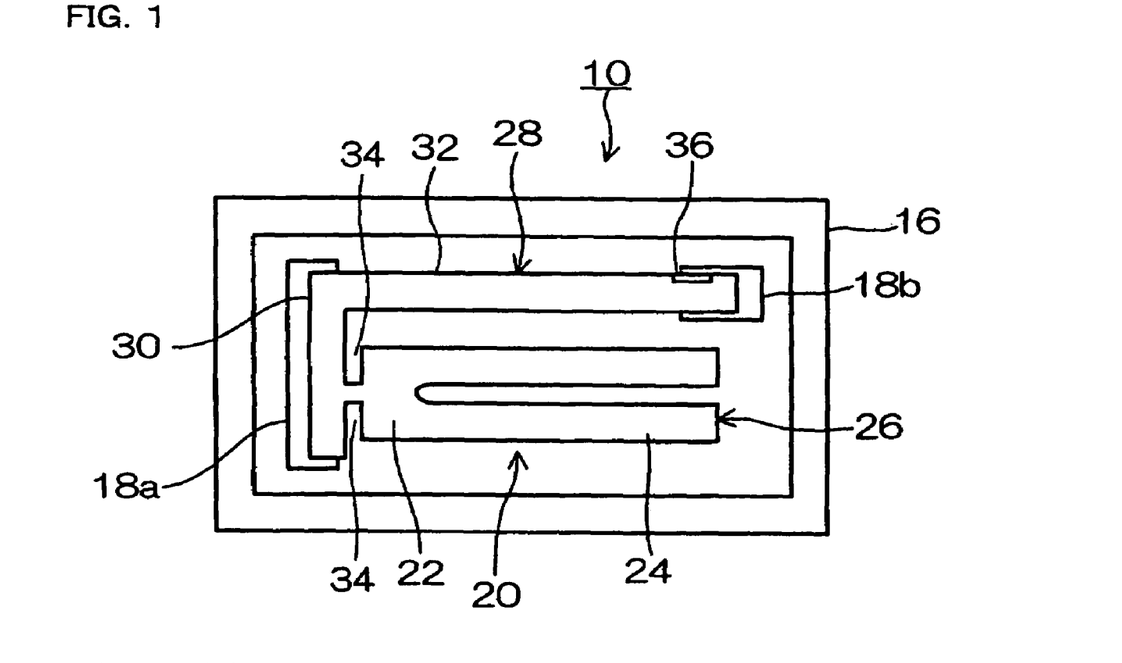
FIG. 1 is a plan view of a tuning-fork-type piezoelectric resonator according to a first embodiment.
Figure 2:
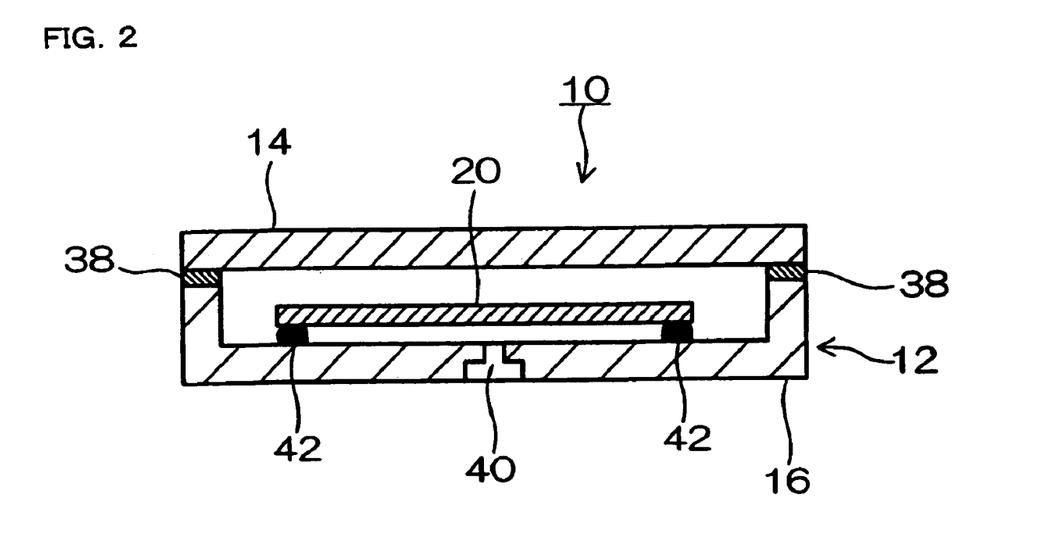
FIG. 2 is a cross-sectional view of the tuning-fork-type piezoelectric resonator according to the first embodiment.

First, a first embodiment of the present invention will be described. FIG. 1 is a plan view of a tuning-fork-type piezoelectric resonator, and FIG. 2 is a cross-sectional view of the tuning-fork-type piezoelectric resonator. A tuning-fork-type piezoelectric resonator 10 is configured such that a tuning-fork-type piezoelectric resonator element 20 is mounted inside a package 12 and the upper part of the package 12 is hermetically sealed with a cover 14.

The tuning-fork-type piezoelectric resonator element 20 includes a piezoelectric resonator element body 26 and a support 28. The piezoelectric resonator element body 26 includes a base 22 and a pair of resonating arms 24 extending from one end of the base 22. The support 28 includes a short side 30 formed along another end of the base 22 opposite the arms 24 and a long side 32 extending from one end of the short side 30 along a long side of the piezoelectric resonator element body 26. The support 28 has an L shape formed by the short side 30 and the long side 32. The short side 30 is also connected to the other end of the base 22. The width of the connecting part is narrowed by a pair of cut grooves 34 formed at both sides thereof so that the vibration leak of the piezoelectric resonator element body 26 is reduced.

In summary, the support 28 is L-shaped and includes a first or short leg 30 connected to substantially orthogonally extending second or long leg 32. The long leg 32 extends along the resonating arms 24. A base 22 of the reed body 26 is connected to the short leg 30 by a relatively narrow connecting part which is formed by grooves cut between the short leg 30 and the base 22.

Further, connection electrodes (not shown) are provided at the bottom face of the short side 30 and at the bottom face on the tip of the long side 32, respectively, so that they are electrically connected to excitation electrodes (not shown) formed at the resonating arms 24. The connection electrodes function as a mount when they are mounted in the package 12. Moreover, a mounting alignment pattern 36 is formed at the long side 32. The mounting alignment pattern 36 is provided to improve location accuracy when mounting the tuning-fork-type piezoelectric resonator element 20 in the package 12. Similar to the excitation electrodes, the mounting alignment pattern 36 is formed of a metal thin film or the like.

The package 12 has a box-like shape. The package 12 is configured such that the cover 14 formed of glass, ceramic or metal is joined to the package base 16 formed of a ceramic insulating substrate or the like via the sealing portion 38 made of low-melting glass. Package-side mounting electrodes 18a and 18b are formed inside the package base 16 so as to mount the tuning-fork-type piezoelectric resonator element 20. The package-side mounting electrodes 18a and 18b are formed corresponding to the connection electrodes that are provided at the short side 30 and the long side 32 of the tuning-fork-type piezoelectric resonator element 20. Particularly, the package-side mounting electrode 18b corresponding to the connection electrode of the long side 32 is formed only under the long side 32, but is not formed under the resonating arms 24. Accordingly, since the resonating arms 24 are not in contact with the package-side mounting electrode 18b, the tuning-fork-type piezoelectric resonator element 20 oscillates. A sealing hole 40 is provided at the bottom of the package base 16 and is used when sealing the package 12 under vacuum. When mounting the tuning-fork-type piezoelectric resonator element 20 in the package 12, the connection electrodes provided at the short side 30 and the long side 32 and the package-side mounting electrodes 18a and 18b are bonded to each other by a conductive adhesive 42.

According to the above-mentioned embodiment, since the tuning-fork-type piezoelectric resonator element 20 is bonded by the connection electrodes formed at the short and long sides 30 and 32, and the package-side mounting electrodes 18a and 18b, the reed 20 can be horizontally mounted relative to the bottom face of the package 12 (i.e., parallel to the bottom face). Therefore, when the tuning-fork-type piezoelectric resonator element 20 oscillates, it is possible to reduce the size of the cavity without the resonating arms 24 contacting the cover 14 and the bottom face of the package base 16. Further, it is not necessary to provide the conventionally required concave portion in the package base 16. Accordingly, it is possible to make the tuning-fork-type piezoelectric resonator 10 thin.

Figure 3A:
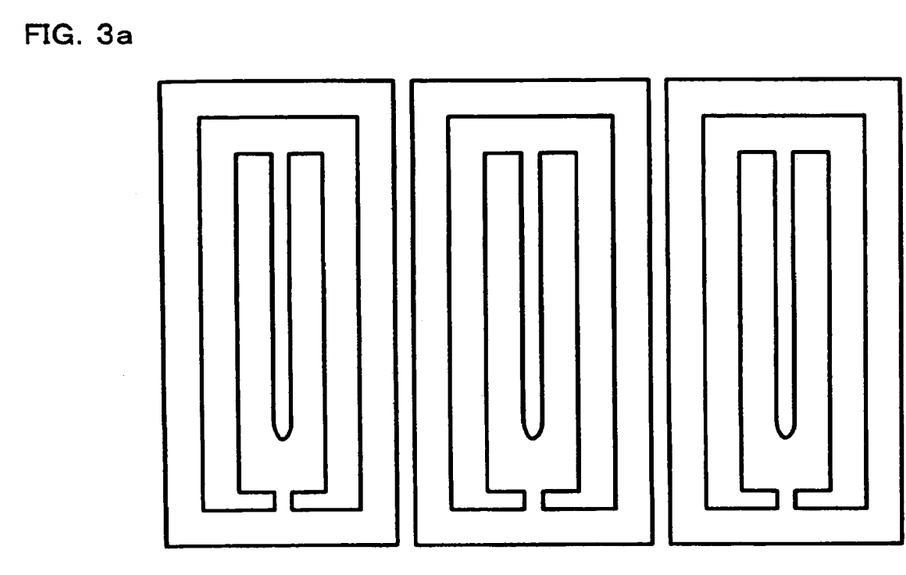
FIGS. 3a and 3b are views illustrating the number of tuning-fork-type piezoelectric resonator elements according to the first embodiment from a piezoelectric wafer.
Figure 3B:
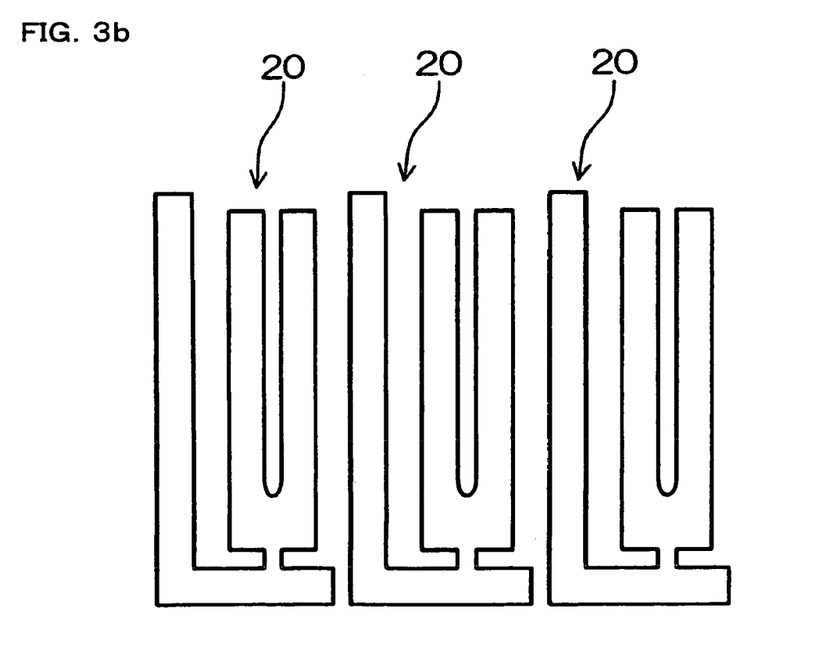

Further, the tuning-fork-type piezoelectric resonator element 20 having an L-shaped support 28 has a smaller outside dimension than that of the conventional tuning-fork-type piezoelectric resonator element surround by a frame in four directions. Therefore, the package 12 for mounting the tuning-fork-type piezoelectric resonator element 20 therein can be miniaturized. Moreover, the tuning-fork-type piezoelectric resonator element 20 has a smaller outside dimension that that of the conventional tuning-fork-type piezoelectric resonator element. Thus, the number of tuning-fork-type piezoelectric resonator elements 20 obtained from one piezoelectric wafer, can be increased. FIG. 3 is a view illustrating the number of obtained tuning-fork-type piezoelectric resonator elements 20.

FIG. 3(a) shows a pattern of tuning-fork-type piezoelectric resonator elements, surrounded by a frame in four directions, on a piezoelectric wafer. FIG. 3(b) shows the pattern of the tuning-fork-type piezoelectric resonator elements 20, having the L-shaped support 28, on a piezoelectric wafer. When the tuning-fork-type piezoelectric resonator elements 20 are patterned at equal intervals and the obtained number of conventional tuning-fork-type piezoelectric resonator elements is 100, the obtained number of tuning-fork-type piezoelectric resonator elements 20 each having the support 28 becomes 145. As a result, 45% more tuning-fork-type piezoelectric resonator elements 20 can be obtained from one piezoelectric wafer than the conventional tuning-fork-type piezoelectric resonator elements.

Figure 4:
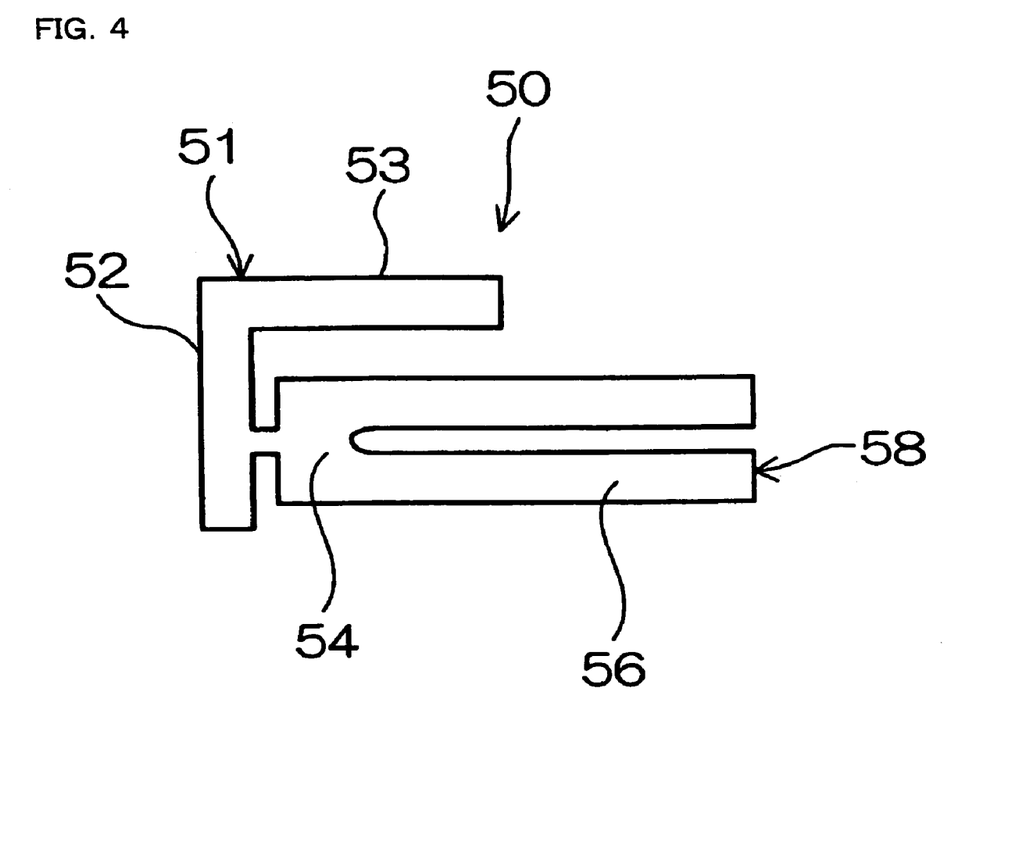
FIG. 4 is a plan view of a tuning-fork-type piezoelectric resonator element according to a second embodiment.

Next, a second embodiment will be described. In the second embodiment, tuning-fork-type piezoelectric resonator element will be described. FIG. 4 is a plan view of a tuning-fork-type piezoelectric resonator element 50 according to the second embodiment. A tuning-fork-type piezoelectric resonator element 50 is the same as the tuning-fork-type piezoelectric resonator element 20 according to the first embodiment except that the length of a long side 53 is different from that of the long side 32.

The tuning-fork-type piezoelectric resonator element 50 includes a piezoelectric resonator element body 58 having a pair of resonating arms 56 extending from one end of a base 54, and a support 51 having a short side 52 and a long side 53 along another end of the base 54 and a long side 53 extending from one end of the short side 52 along a long side of the piezoelectric resonator element body 58. The long side 53 is shorter than a long side of the piezoelectric resonator element body 58, and, for example, the length of the long side 53 is half that of the long side of the piezoelectric resonator element body 58.

Connection electrodes (not shown) are provided at the bottom face of the short side 52 and at the bottom face on the tip of the long side 53, respectively. The connection electrodes functions as a mount when they are mounted in a package.

Moreover, a mounting alignment pattern may be formed at the long side 53 of the tuning-fork-type piezoelectric resonator 50.

Since the tuning-fork-type piezoelectric resonator element 50 is bonded to the inside of a package through the mount, it can be horizontally mounted relative to the bottom face of the package. Therefore, when the tuning-fork-type piezoelectric resonator element 50 oscillates, it is possible to reduce the size of the cavity without the resonating arms 56 contacting the cover and the bottom face of the package base. Further, it is not necessary to provide the conventional concave portion in the package base. Accordingly, it is possible to make the tuning-fork-type piezoelectric resonator thin. Moreover, the tuning-fork-type piezoelectric resonator element 50 has a smaller outside dimension than that of the conventional tuning-fork-type piezoelectric resonator element surrounded by a frame in four directions. Therefore, the package for mounting the tuning-fork-type piezoelectric resonator element 50 can be miniaturized.

Figure 5:
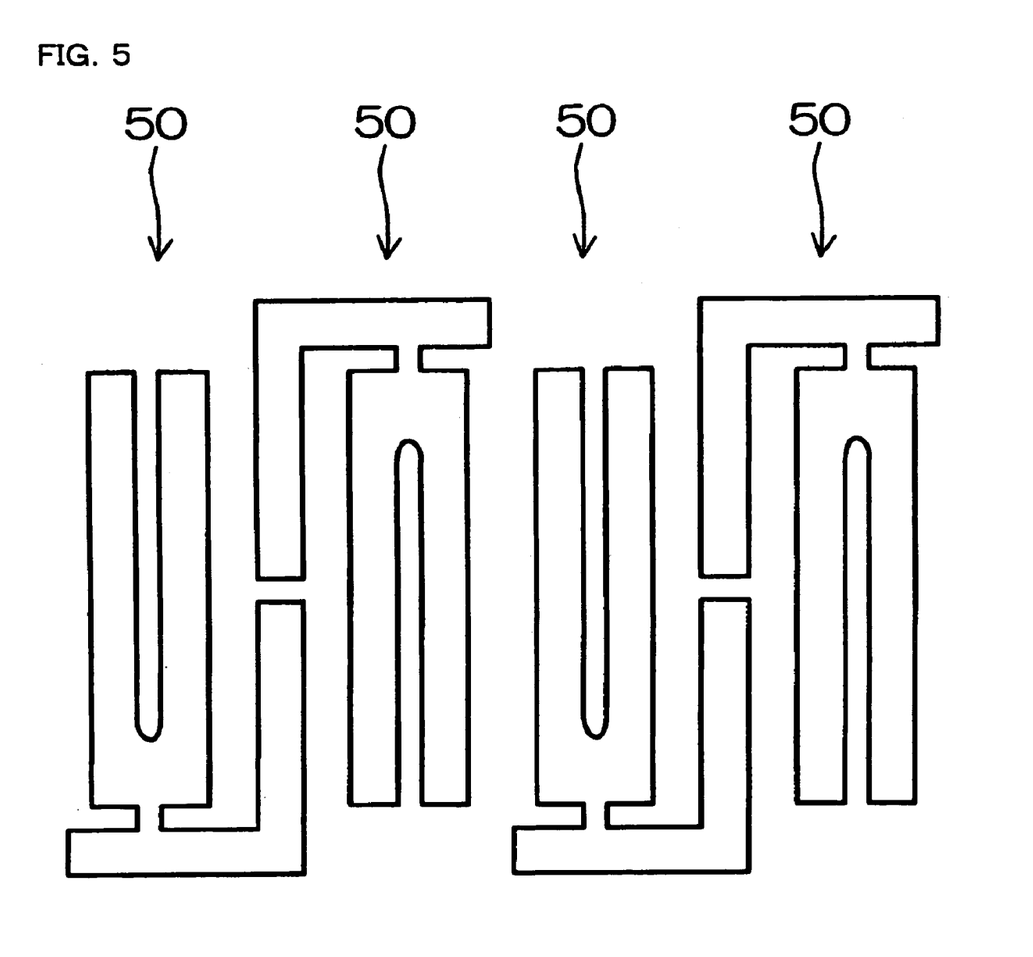
FIG. 5 is a view illustrating the number of tuning-fork-type piezoelectric resonator elements according to the second embodiment of the present invention obtained from a piezoelectric wafer.

Further, the support 51 provided at the tuning-fork-type piezoelectric resonator element 50 has a smaller outside dimension because it is provided along another end of the base 54 and a part of the long side of the piezoelectric resonator element body 58. Therefore, the number of tuning-fork-type piezoelectric resonator elements 50 obtained from one piezoelectric wafer can be increased. FIG. 5 is a view illustrating the number of tuning-fork-type piezoelectric resonator elements 50 obtained from a piezoelectric wafer. When a pattern is formed by alternately arranging the tuning-fork-type piezoelectric resonator elements 50 on the piezoelectric wafer, the number of tuning-fork-type piezoelectric resonator elements 50 installed on one piezoelectric wafer becomes 177.

The obtained number of the conventional tuning-fork-type piezoelectric resonator elements surrounded by a frame in four directions is 100. As a result, 77% more of the tuning-fork-type piezoelectric resonator elements 50 are obtained from one piezoelectric wafer than the conventional tuning-fork-type piezoelectric resonator elements.

Figure 6:
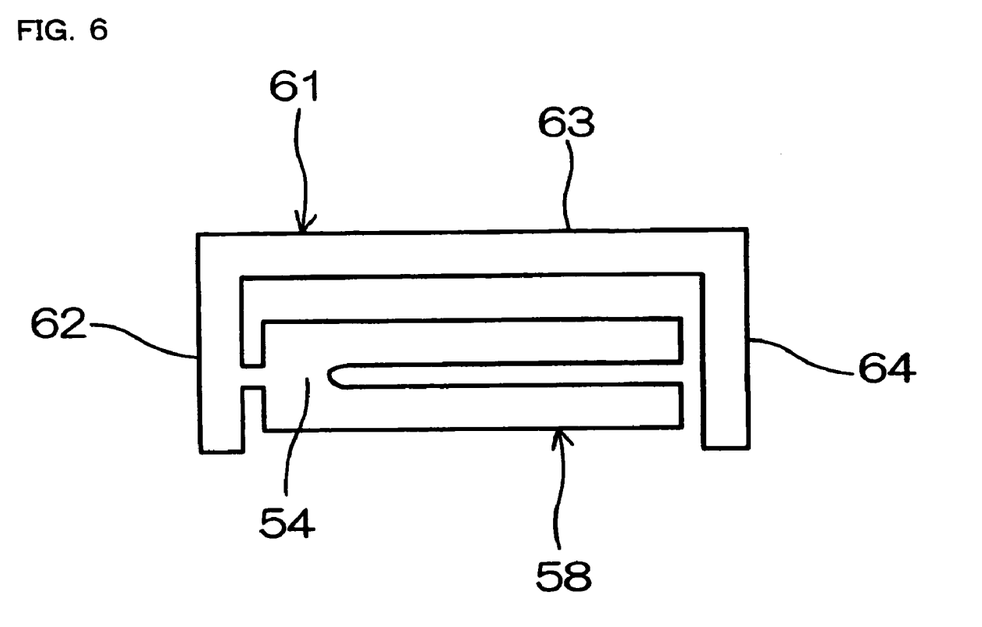
FIG. 6 is a view showing a modified example of the tuning-fork-type piezoelectric resonator element according to the second embodiment.

In addition to the above-described shape of the support 51, a support 61 may be provided along both short sides and one long side of the piezoelectric resonator element body 58. FIG. 6 is a plan view of a tuning-fork-type piezoelectric resonator element having a support 61. The support 61 includes a first short side 62 formed along one end of a base 54, a long side 63 extending from one end of the first short side 62, and second short side 64 provided at the front end of the long side 63 to face the first short side 62, which forms a U shape.

The same effects as those of the first embodiment can be obtained by the above construction. That is, when a tuning-fork-type piezoelectric resonator element is mounted in a package, it can be horizontally mounted relative to the bottom face of the package, which leads to a reduced size cavity. Accordingly, it is possible to make the tuning-fork-type piezoelectric resonator thin. Moreover, it is possible to decrease the outside dimension of the tuning-fork-type piezoelectric resonator element as compared with the conventional tuning-fork-type piezoelectric resonator element surrounded by a frame in four directions.

Next, a third embodiment will be described. In the third embodiment, a tuning-fork-type piezoelectric resonator element will be described. FIG. 7 is a view illustrating shapes of tuning-fork-type piezoelectric resonator elements according to a third embodiment, wherein FIGS. 7(a) to 7(d) show modified examples of the support.

Figure 7A:
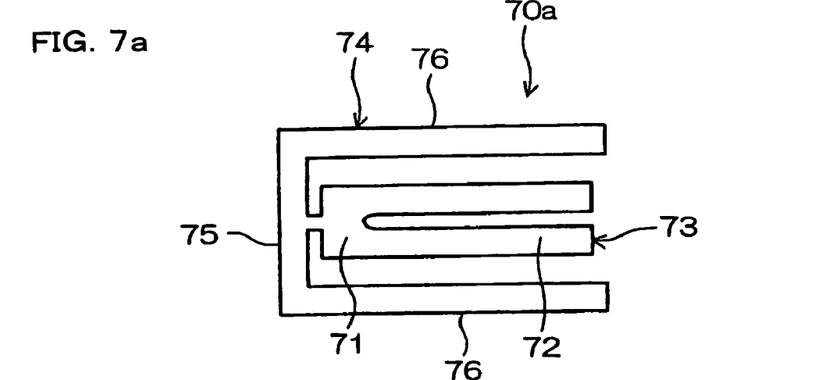
FIGS. 7a–7d are views illustrating a shape of a tuning-fork-type piezoelectric resonator element according to a third embodiment.
Figure 7B:
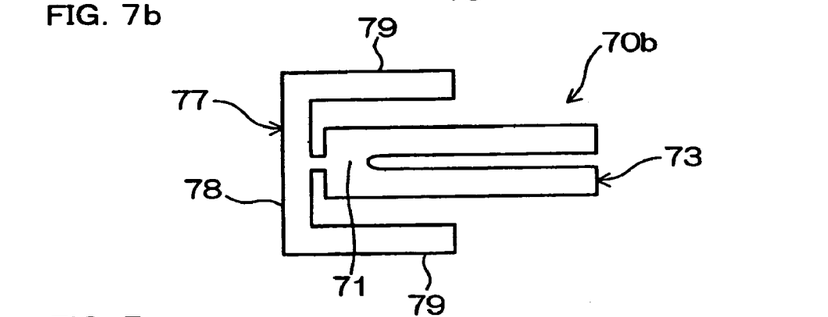

As shown in FIG. 7(a), a piezoelectric resonator element body 73 of a tuning-fork-type piezoelectric resonator element 70a includes resonating arms 72 extending from one end of a base 71. A support 74 includes a short side 75 along another end of the base 71, and long sides 76 extending from both ends of the short side 75 in the longitudinal direction of the piezoelectric resonator element body 73. Further, as shown in FIG. 7(b), a tuning-fork-type piezoelectric resonator element 70b includes a piezoelectric resonator element body 73 and a support 77. The support 77 includes a short side 78 along another end of the base 71, and long sides 79 extending from both ends of the short side 78 in the longitudinal direction of the piezoelectric resonator element body 73. Each of the long sides 79 is shorter in length than a long side of the piezoelectric resonator element body 73. For example, each length of the long sides 79 is half that of the long side of the piezoelectric resonator element body 73. When the tuning-fork-type piezoelectric resonator elements 70a and 70b are mounted in a package, the bottom faces of the short sides 75 and 78, and the bottom faces at both ends of the two long sides 76 and 79 are joined to the package by a conductive adhesive, so that the tuning-fork-type piezoelectric resonator elements 70a and 70b can be mounted in a package while being kept horizontal (parallel) to the bottom face of the package.

Figure 7C:
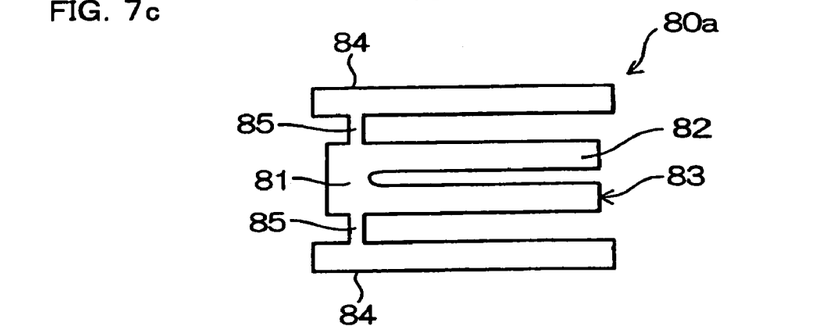

Further, as shown in FIG. 7(c), a tuning-fork-type piezoelectric resonator element 80a includes a piezoelectric resonator element body 83 and a support 84. The piezoelectric resonator element body 83 includes a base 81 and resonating arms 82. The support 84 is provided along long sides at both sides of the piezoelectric resonator element body 83, and is connected to the piezoelectric resonator element body 83 through a connecting portion 85.

Figure 7D:
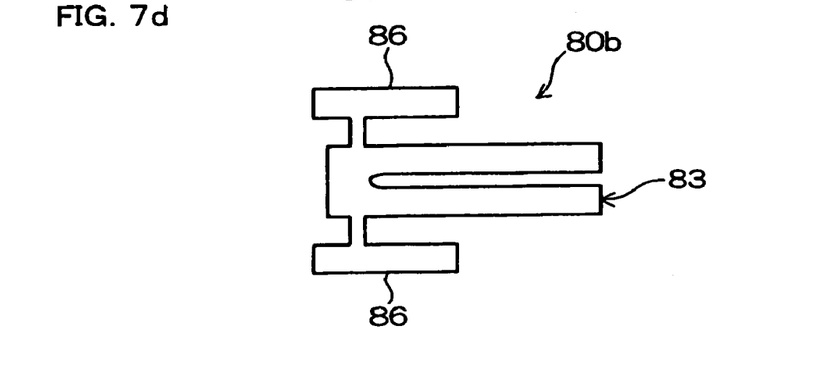

Moreover, as shown in FIG. 7(d), a tuning-fork-type piezoelectric resonator element 80b is the same as the tuning-fork-type piezoelectric resonator element 80a except that a support 86 is different in length from the support 84. That is, the support 86 is shorter than a long side of the piezoelectric resonator element body 83, and for example, the length of the support 86 is half that of the piezoelectric resonator element body 83. When the tuning-fork-type piezoelectric resonator elements 80a and 80b are mounted in a package, both bottom faces at both ends of the supports 84 and 86, i.e., four portions of the supports 84 and 86 are joined by a conductive adhesive, so that the tuning-fork-type piezoelectric resonator elements 80a and 80b are mounted in a package while being kept horizontal (parallel) to the bottom face of the package.

What is claimed is:

1. A tuning-fork-type piezoelectric resonator element comprising:
    a piezoelectric resonator element body including:
        a base; and
        a pair of laterally spaced apart resonating arms extending substantially in parallel from a first end of the base;
    a support including:
        a first leg connected to a second end of the base opposite the resonating arms;
        a second leg extending substantially orthogonally from a first end of the first leg; and
        a third leg extending substantially orthogonally from a second end of the first leg;
    wherein the piezoelectric resonator element body is connected to the first leg by a relatively narrow connecting part, and the support has a U-shape with second and third legs projecting substantially parallel to the resonating arms.

2. The tuning-fork-type piezoelectric resonator element according to claim 1,
    wherein the second and third legs are shorter than the piezoelectric resonator element body.

3. A tuning-fork-type piezoelectric resonator comprising:
    the tuning-fork-type piezoelectric resonator element according to claim 1 mounted in a package by mounts; and
    a cover joined to an upper portion of the package.

4. A tuning-fork-type piezoelectric resonator element comprising:
    a piezoelectric resonator element body including:
        a base; and
        a pair of laterally spaced apart resonating arms extending substantially in parallel from one end of the base;
    a support including:
        a first leg connected to a first side of the base with a first connecting part; and
        a second leg connected to a second side of the base with a second connecting part;
    wherein first side of the base is opposite the second side, and the first and second legs project substantially parallel to the resonating arms.

5. The tuning-fork-type piezoelectric resonator element according to claim 4,
    wherein the first and second legs are shorter than the piezoelectric resonator element body.

6. A tuning-fork-type piezoelectric resonator comprising:
    the tuning-fork-type piezoelectric resonator element according to claim 4 mounted in a package by mounts; and
    a cover joined to an upper portion of the package.

* * * * *